United States Patent [19]

Capasso et al.

[11] 4,390,889
[45] Jun. 28, 1983

[54] PHOTODIODE HAVING AN INGAAS LAYER WITH AN ADJACENT INGAASP P-N JUNCTION

[75] Inventors: Federico Capasso, Westfield; Albert L. Hutchinson, Piscataway; Ralph A. Logan, Morristown, all of N.J.

[73] Assignee: Bell Telephone Laboratories, Incorporated, Murray Hill, N.J.

[21] Appl. No.: 195,333

[22] Filed: Oct. 9, 1980

[51] Int. Cl.$^3$ .................. H01L 29/90; H01L 29/161; H01L 29/14
[52] U.S. Cl. ...................................... 357/30; 357/13; 357/16
[58] Field of Search ....................... 357/30, 14, 13, 17

[56] References Cited

U.S. PATENT DOCUMENTS 4,231,049 10/1980 Pearsall .............................. 357/16 X
4,323,911 4/1982 Campbell et al. ................. 357/16 X

OTHER PUBLICATIONS

K. Iga, T. Kambayashi, K. Wakao and Y. Sakamoto "GaInAsP/InP Facet Lasers with Chemically-Etched End Mirrors", *Japanese Journal of Applied Physics*, vol. 18, No. 10 (1979), pp. 2035-2036.

M. A. Pollack, R. E. Nahorg, J. C. DeWinter and A. A. Ballman, "Liquid Phase Epitaxial In$_{l-x}$Ga$_x$As$_y$P$_{l-y}$ Lattice Matched to <100> InP Over the Complete Wavelength Range 0.92 $\leq \chi \leq$ 1.65 $\mu$m", *Applied Physics Letters*, vol. 33, No. 4 (1978), pp. 314-316.

K. Nishida, K. Tagucki, and Y. Matsumoto, "InGaAsP Heterostructure Avalanche Photodiodes with High Avalanche Gain", *Applied Physics Letters*, vol. 35, No. 3 (1979), pp. 251-253.

T. P. Pearsall and M. Papuchon, "The Ga$_{0.47}$In$_{0.53}$ As Homojunction Photodiode—A New Avalanche Photo Detector in the Near Infrared Between 1.0 and 1.6 $\mu$m", *Applied Physics Letters*, vol. 33, No. 7 (1978), pp. 640-642.

T. P. Lee, C. A. Burrus, A. G. Dentai and K. Ogawa, "Small Area InGaAs/InP p-i-n Photodiodes: Fabrication, Characteristics and Performance of Devices in 274 Mb/s and 45 Mb/s Lightwave Receivers at 1.31 $\mu$m Wavelength", *Electronic Letters*, vol. 16, No. 4 (1980), pp. 155-156.

*Primary Examiner*—Martin H. Edlow
*Assistant Examiner*—J. Carroll
*Attorney, Agent, or Firm*—Richard D. Laumann

[57] ABSTRACT

A photodetector useful between 1.0 and 1.6 microns and having an InGaAs layer with an adjacent InGaAsP p-n junction disposed on the InGaAs layer is described.

18 Claims, 1 Drawing Figure

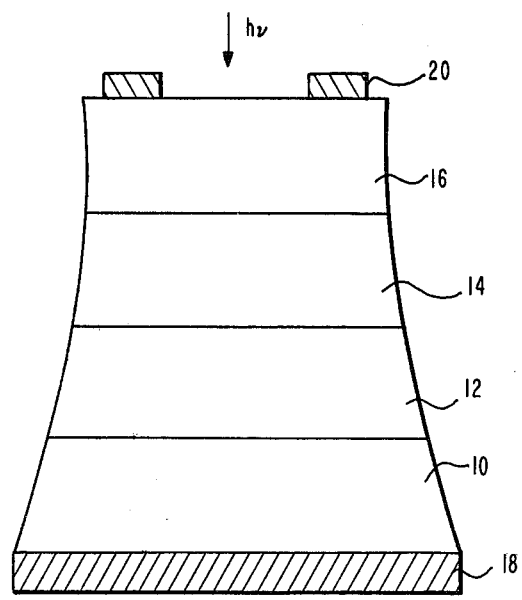

PHOTODIODE HAVING AN INGAAS LAYER WITH AN ADJACENT INGAASP P-N JUNCTION

TECHNICAL FIELD

This invention relates generally to photodetectors and particularly to photodetectors using InGaAs.

BACKGROUND OF THE INVENTION

The realization that losses in and material dispersion of silica based optical fibers may be minimized by using wavelengths within the region between 1.0 and 1.6 microns ($\mu$m) has stimulated interest in light sources and photodetectors capable of operating within that wavelength region. Special interest has been directed toward the wavelength region from approximately 1.0 to 1.6 $\mu$m because that appears, at present, to be the optimum wavelength region with respect to minimum light losses.

A photodetector is an essential component of an optical communication system and much effort has been directed toward developing structures and materials for such structures. Due to the favorable size of the bandgaps, interest has centered on devices, both light sources and photodetectors, using III-V elements. Devices using binary semiconductors, such as GaSb; ternary semiconductors, such as InGaAs, and GaAlSb; and quaternary semiconductors, such as InGaAsP; have been constructed with III-V elements. For example, avalanche photodiodes and p-i-n photodiodes with different structures and combinations of the III-V elements previously mentioned have been considered for use. The photodetector ultimately selected should satisfy several requirements. It should have good quantum efficiency, low dark current characteristics, and relatively low capacitance.

One approach to photodetectors operating within the wavelength region between 1.0 $\mu$m and 1.6 $\mu$m uses InGaAs grown on InP substrates. Different embodiments of this approach are described in *Applied Physics Letters*, 33, pp. 640–642, Oct. 1, 1978 and *Electronics Letters*, 16, pp. 155–156, 1980. The former article described a homojunction avalanche photodiode which had a reverse current of 2 nA at half the breakdown voltage. This current corresponded to a dark current density of $4 \times 10^{-6}$ A/cm$^2$. The latter article described a p-i-n photodiode which was back illuminated and had a dark current of 2 to 5 nA at a reverse bias of 10 volts.

Another approach to photodetectors operating within the same wavelength region is described in *Applied Physics Letters*, 35, pp. 251–253, Aug. 1, 1979. This article described an InGaAsP heterostructure avalanche photodiode having layers of n-type InGaAsP and n-type InP sequentially grown on an n+-type InP substrate. A p+-type InP region is formed in the InP layer by cadmium diffusion. The resulting photodiode operates with an avalanche junction in the wider bandgap material, InP, near the narrow gap material, InGaAsP, with the latter material absorbing the light. The device is stated to have good quantum efficiency and avalanche gain when operated at a relatively high reverse bias. Quantum efficiencies of greater than 60 percent and an avalanche gain of 3000 were reported. However, a valence band barrier of approximately 0.4 volts blocks the diffusion of holes produced by light absorption in the quaternary layer. The holes surmount the barrier only when there is a large electric field near the heterojunction which can accelerate holes. Further, when operating in the avalanche region, tunneling occurs and the dark current rises. Due to the presence of large tunneling currents which cause a significant amount of detector noise, it may be difficult to make low noise avalanche photodetectors from III-V materials.

SUMMARY OF THE INVENTION

Our invention is a photodiode with low dark current and low capacitance suitable for use in the wavelength region between 1.0 and 1.6 $\mu$m. In a preferred embodiment, the photodetector has an InP substrate and a lattice matched InGaAs layer disposed on the substrate. A lattice matched InGaAsP p-n junction is disposed on and lattice matched to the InGaAs layer. The p-n junction is formed in material which has a bandgap larger than the bandgap of the InGaAs. In a preferred embodiment, the p-n junction is formed by first and second InGaAsP layers sequentially grown on and lattice matched to the InGaAs layer and the substrate. The InGaAs and first InGaAsP layers have a first conductivity type and the second InGaAsP layer has a second conductivity type. In a preferred embodiment, the first and second conductivity types are n- and p-type, respectively. The photodetector may be illuminated through either the InGaAsP layers or the InP substrate. In the n-type layers, the dopant concentration is typically between $10^{15}$/cm$^3$ and $10^{16}$/cm$^3$, and in the p-type layer, the dopant concentration is in the range between approximately $3 \times 10^{17}$/cm$^3$ and $5 \times 10^{18}$/cm$^3$. For light having a wavelength of approximately 1.3 $\mu$m, the absorption layer is the InGaAs layer, and the p-n junction is formed within the InGaAsP layers. Use of a p-n type junction located in the higher bandgap material results in a dark current smaller than when the p-n junction is located in a lower bandgap material. The device operates at low voltages without avalanching.

Other substrate materials may be used, provided the InGaAs layer is lattice matched. Other materials may be used for the light absorbing layer provided they are lattice matched to the substrate and have a bandgap less than that of the lattice matched material in which the p-n junction is formed adjacent to the light absorbing layer.

BRIEF DESCRIPTION OF THE DRAWING

The FIGURE is an illustration of one embodiment of this invention.

DETAILED DESCRIPTION

An embodiment of the photodiode of this invention is shown in the FIGURE. In the embodiment depicted, photodiode 1 includes an indium phosphide (InP) substrate 10, an n-type indium gallium arsenide (InGaAs) layer 12, an n-type first indium gallium arsenide phosphide (InGaAsP) layer 14, and a p+-type second indium gallium arsenide phosphide (InGaAsP) layer 16. The device further includes ohmic contacts 18 and 20 made to layers 10 and 16, respectively. Layers 12, 14, and 16 are lattice matched to the InP substrate and layer 12 which is the light absorbing layer has the nominal compositions In$_{0.53}$Ga$_{0.47}$As. Layers 14 and 16 have a composition which lattice matches them to layer 12. Although depicted as front illuminated, the photodetector may also be back illuminated, i.e., light may enter the photodetector through the substrate. When the photodetector is front illuminated, the light first passes through layers 14 and 16 and is then absorbed in layer 12.

The substrate may be any material that is lattice matched to the InGaAs layer. A lattice matched InGaAsP p-n junction is disposed on the InGaAs layer. The term "InGaAsP" refers to compositions having the atom composition $In_{1-x}Ga_xAs_yP_{1-y}$, x and y greater than or equal to 0.0 and less than or equal to 1.0. By choice of appropriate lattice matched composition, the quaternary bandgap can take any value between that of InP and InGaAs.

InP substrate 10 is doped with sulfur or tin to a concentration of at least $10^{17}/cm^3$ and desirably $10^{18}/cm^3$ or higher. The n-type layers 12 and 14 are nominally undoped and have donor concentrations that are typically between $10^{15}/cm^3$ and $10^{16}/cm^3$. Higher concentrations are undesirable if low capacitance and low dark current operation are to be obtained simultaneously because the undoped ternary and quaternary layers have to be substantially depleted at relatively low bias, i.e., at less than 20 volts. Layer 16 is typically doped with Zn at a concentration of approximately $3 \times 10^{17}/cm^3$ although concentrations between $10^{17}/cm^3$ and $10^{19}/cm^3$ may be used. A high doping concentration facilitates the formation of an ohmic contact. The thicknesses of layers 12, 14, and 16 are all typically between 1 and 2 microns. In a preferred embodiment, thicknesses of layers 12, 14, and 16 are 1.5, 1 and 2 microns, respectively.

The device parameters, including layer thicknesses and doping concentrations, may be varied depending upon the desired device characteristics and performance. The depletion layer capacitance is inversely proportional to the depletion layer width which, in turn, is inversely proportional to the square root of the doping concentration and proportional to the square root of the voltage in the case of an abrupt junction. Thus, if lower capacitance is desired, the doping concentration should be reduced. The desired parameters also depend upon the desired performance characteristics. For example, at high frequencies it is most desirable to reduce total capacitance while at low frequencies, a low dark current is most desirable. A low doping concentration in layers 12 and 14 leads to a wider depletion layer and lowers the dark current as the bias is lower. The practical lower limit of doping concentration with present techniques is approximately $10^{15}/cm^3$, although it is probable that improved techniques will permit lower levels to be attained.

The area of the photodetector is between $2.7 \times 10^{-4}/cm^2$ and $5 \times 10^{-5}/cm^2$ to obtain low capacitance, i.e., less than 0.5 pF, if a doping concentration of approximately $2 \times 10^{15}/cm^3$ is used in the n-type layers, and the n-type layers have a thickness of approximately 2.7 μm. At $-10$ volts, the n-type layers are completely depleted so that the capacitance has achieved its minimum value, and the photodiode is operating as a p-i-n detector.

The device may be grown by modifications of standard and well known liquid phase epitaxy techniques such as that described in *Applied Physics Letters*, 33, pp. 314-316, Aug. 15, 1978. Prior to initiation of growth, the In melt undergoes a high temperature bakeout. A temperature of approximately 800 degrees C. for a time period between 16 and 96 hours has been found suitable. The growth routine starts at 675 degrees C. with a melt back step, a Sn doped buffer layer 15 μm thick is grown and followed by InGaAs and lattice matched InGaAsP layers which are both undoped n-type grown at a 1 degree/minute cooling rate. A Zn doped p+-type quaternary layer of the same composition as the preceding layer is grown. It has also been found desirable to use a high purity Si free, InP source. The above steps reduce the undesired impurity concentrations. The mesa is etched using wet etching techniques which are described in *Japanese Journal of Applied Physics*, 18, pp. 2035-2036, 1979. Ohmic contacts 18 and 20 to substrate 10 and layer 16 may be made with conventional alloyed Au-Sn and Au-Zn, respectively.

The device is reversed biased with a voltage that is typically in the range between 10 and 15 volts. For a device having an area of $1.3 \times 10^{-4}/cm^2$, dark currents, at $-10$ volts, as low as 0.2 nA are obtained. The low dark current is a result of the p-n junction being in the InGaAsP quaternary layer and is substantially smaller than the dark current typical of InGaAs detectors. The dark current is reduced because the p-n junction is formed in material having a bandgap greater than that of the absorbing layer. The capacitance at $-10$ volts is approximately 0.2 pF for a device area of approximately $5 \times 10^{-5}/cm^2$. An external quantum efficiency of approximately 60 percent is obtained at 1.3 μm with front illumination.

Although the structure depicted has a p-n-n conductivity configuration, it is to be understood that the device may also be made in a n-p-p conductivity configuration. Thus, InP substrate 10 and InGaAs layer 12 and first InGaAsP layer 14 may be described as having a first conductivity type and second InGaAsP layer 16 as having a second conductivity type. For the embodiment described with respect to the FIGURE, the first conductivity type is n-type and the second is p-type.

Other modifications are readily thought of. Semiconductors other than InGaAsP may be used for layers 14 and 16 provided they are lattice matched to and have a bandgap larger than that of the material of layer 12 which might be GaSb. In this case, layers 14 and 16 could be formed by AlGaAsSb. Although a mesa structure has been described, a planar device can be made by diffusion into a, e.g., InGaAsP, layer to form a p-n junction.

We claim:

1. A photodiode comprising a semiconductor substrate having a first conductivity type, a first lattice matched semiconductor layer disposed on said substrate and having said first conductivity type;

a lattice matched p-n junction in a second lattice matched semiconductor disposed on said first semiconductor layer characterized in that said second semiconductor has a bandgap larger than the bandgap of said first semiconductor; said p-n junction is formed by a second semiconductor layer having a first conductivity type and a third semiconductor layer having a second conductivity type; said second semiconductor layer having a dopant concentration less than $10^{16}/cm^3$.

2. A photodiode as recited in claim 1 in which said semiconductor substrate has a bandgap energy larger than that of the first lattice matched semiconductor layer.

3. A photodiode as recited in claim 1 or 2 in which said first lattice matched semiconductor comprises InGaAs.

4. A photodiode as recited in claim 2 in which said substrate comprises InP.

5. A photodiode as recited in claim 3 in which said second semiconductor comprises InGaAsP.

6. A photodiode as recited in claim 4 in which said p-n junction is formed by a first InGaAsP layer disposed on said InGaAs layer and having said first conductivity type, and a second InGaAsP layer disposed on said first InGaAsP layer and having a second conductivity type.

7. A photodiode as recited in claim 5 further comprising an ohmic contact to said substrate and an ohmic contact to said second InGaAsP layer.

8. A photodiode as recited in claim 6 in which said first conductivity type is n-type.

9. A photodiode as recited in claim 7 in which said first InGaAsP layer has a donor concentration between $10^{15}/cm^3$ and $10^{16}/cm^3$.

10. A photodiode comprising a semiconductor substrate having a first conductivity type, a first lattice matched semiconductor layer disposed on said substrate and having said first conductivity type, said first lattice matched semiconductor comprises InGaAs;

a lattice matched p-n junction in a second lattice matched semiconductor disposed on said first semiconductor layer characterized in that said second semiconductor has a bandgap larger than the bandgap of said first semiconductor, said semiconductor substrate has a bandgap energy larger than that of the first lattice matched semiconductor layer.

11. A photodiode as recited in claim 10 in which said substrate comprises InP.

12. A photodiode as recited in claim 11 in which said second semiconductor comprises InGaAsP.

13. A photodiode as recited in claim 12 in which said p-n junction is formed by a first InGaAsP layer disposed on said InGaAs layer and having said first conductivity type, and a second InGaAsP layer disposed on said first InGaAsP layer and having a second conductivity type.

14. A photodiode as recited in claim 13 further comprising an ohmic contact to said substrate and an ohmic contact to said second InGaAsP layer.

15. A photodiode as recited in claim 14 in which said first conductivity type is n-type.

16. A photodiode as recited in claim 15 in which said first InGaAsP layer has a donor concentration between $10^{15}/cm^3$ and $10^{16}/cm^3$.

17. A photodiode as recited in claim 1 in which said first lattice matched semiconductor comprises GaSb.

18. A photodiode as recited in claim 1 or 17 in which said second semiconductor comprises AlGaAsSb.

* * * * *

UNITED STATES PATENT AND TRADEMARK OFFICE
CERTIFICATE OF CORRECTION

PATENT NO. : 4,390,889
DATED : June 28, 1983
INVENTOR(S) : Federico Capasso, Albert L. Hutchinson, and Ralph A. Logan It is certified that error appears in the above—identified patent and that said Letters Patent is hereby corrected as shown below:

In the Claims, column 4, line 67, "claim 2" should read --claim 3--. Column 5, line 1, "claim 3" should read --claim 4--; line 3, "claim 4" should read --claim 5--; line 9, "claim 5" should read --claim 6--; line 12, "claim 6" should read --claim 7--; line 14, "claim 7" should read --claim 8--.

Signed and Sealed this

Eleventh Day of October 1983

[SEAL]

Attest:

GERALD J. MOSSINGHOFF

Attesting Officer     Commissioner of Patents and Trademarks